(12) United States Patent
Wolf et al.

(10) Patent No.: US 11,796,574 B2
(45) Date of Patent: Oct. 24, 2023

(54) INTEGRATION OF CURRENT SENSOR WITH BUSBAR

(71) Applicant: Ford Global Technologies, LLC, Dearborn, MI (US)

(72) Inventors: Christopher Wolf, Ann Arbor, MI (US); Michael W. Degner, Novi, MI (US); Franco Leonardi, Dearborn Heights, MI (US); Seth Avery, Livonia, MI (US)

(73) Assignee: FORD GLOBAL TECHNOLOGIES, LLC, Dearborn, MI (US)

( * ) Notice: Subject to any disclaimer, the term of this patent is extended or adjusted under 35 U.S.C. 154(b) by 53 days.

(21) Appl. No.: 17/143,915

(22) Filed: Jan. 7, 2021

(65) Prior Publication Data
US 2022/0214382 A1 Jul. 7, 2022

(51) Int. Cl.
*G01R 15/20* (2006.01)
*G01R 19/00* (2006.01)

(52) U.S. Cl.
CPC ....... *G01R 15/207* (2013.01); *G01R 19/0092* (2013.01)

(58) Field of Classification Search
CPC .......................... G01R 15/207; G01R 19/0092
See application file for complete search history.

(56) References Cited

U.S. PATENT DOCUMENTS

| | | | |
|---|---|---|---|
| 6,085,599 A | 7/2000 | Feller | |
| 8,635,916 B1 * | 1/2014 | Loverich | G01M 5/0066 73/768 |
| 8,810,235 B2 * | 8/2014 | Ueno | G01R 15/207 324/253 |
| 11,269,024 B2 * | 3/2022 | Tanabe | H05K 3/305 |
| 2008/0094060 A1 * | 4/2008 | Muraki | G01R 15/207 324/252 |
| 2010/0188078 A1 | 7/2010 | Foletto et al. | |
| 2012/0001627 A1 * | 1/2012 | Flock | G01R 33/0047 324/252 |
| 2013/0249029 A1 * | 9/2013 | Vig | G01R 33/0047 257/427 |
| 2013/0249544 A1 * | 9/2013 | Vig | G01R 33/0047 324/252 |
| 2018/0031613 A1 * | 2/2018 | Nakayama | G01R 19/25 |
| 2019/0339307 A1 * | 11/2019 | Hebiguchi | G01R 33/09 |
| 2021/0080489 A1 * | 3/2021 | Koizumi | G01D 5/145 |

FOREIGN PATENT DOCUMENTS

AU 2010295220 B2 3/2011

* cited by examiner

*Primary Examiner* — Dominic E Hawkins
(74) *Attorney, Agent, or Firm* — David B. Kelley; Brooks Kushman, P.C.

(57) ABSTRACT

An electrical current sensing arrangement includes a busbar, a dielectric material containing therein a magnetic field sensor, and a ferromagnetic over-mold encapsulating a portion of the busbar and the dielectric material. The dielectric material is disposed against the busbar such that the magnetic field sensor is spaced away from the busbar and the ferromagnetic over-mold is not between the busbar and the magnetic field sensor.

20 Claims, 4 Drawing Sheets

INTEGRATION OF CURRENT SENSOR WITH BUSBAR

TECHNICAL FIELD

The present disclosure relates to current sensing systems that may be used in electric motor vehicles.

BACKGROUND

Electric vehicles (EV), like other electric devices, typically include a current sensing system. More specifically, current sensing systems are commonly used in conjunction with inverters and DC-DC convertors to measure the flow of electrical current. Among other applications, the measurements gathered by the current sensing systems may be used to evaluate and actively influence the charging and discharging cycle of the battery and to control the pulse-width modulated inverter switches. With an increase in interest for deployment of electric vehicles worldwide, demand for compact and accurate current sensing systems has increased.

SUMMARY

An electrical system includes a bent busbar defining a corner between a pair of legs, a magnetic field sensor disposed in an inner portion of the corner and spaced away from the legs such that the magnetic field sensor is between the legs, a dielectric material encapsulating the magnetic field sensor and in direct contact with the legs, and a ferromagnetic over-mold encapsulating the corner and the dielectric material.

An electrical current sensing arrangement includes a busbar, a dielectric material containing therein a magnetic field sensor, and a ferromagnetic over-mold encapsulating a portion of the busbar and the dielectric material. The dielectric material is disposed against the busbar such that the magnetic field sensor is spaced away from the busbar and the ferromagnetic over-mold is not between the busbar and the magnetic field sensor.

An electrical system includes a plurality of busbars, a plurality of housings, a plurality of magnetic field sensors each disposed adjacent to one of the busbars and contained by one of the housings, and at least one ferromagnetic over-mold encapsulating portions of the busbars and the housings. The housings electrically insulate the magnetic field sensors from the busbars.

DETAILED DESCRIPTION

Figure 1:
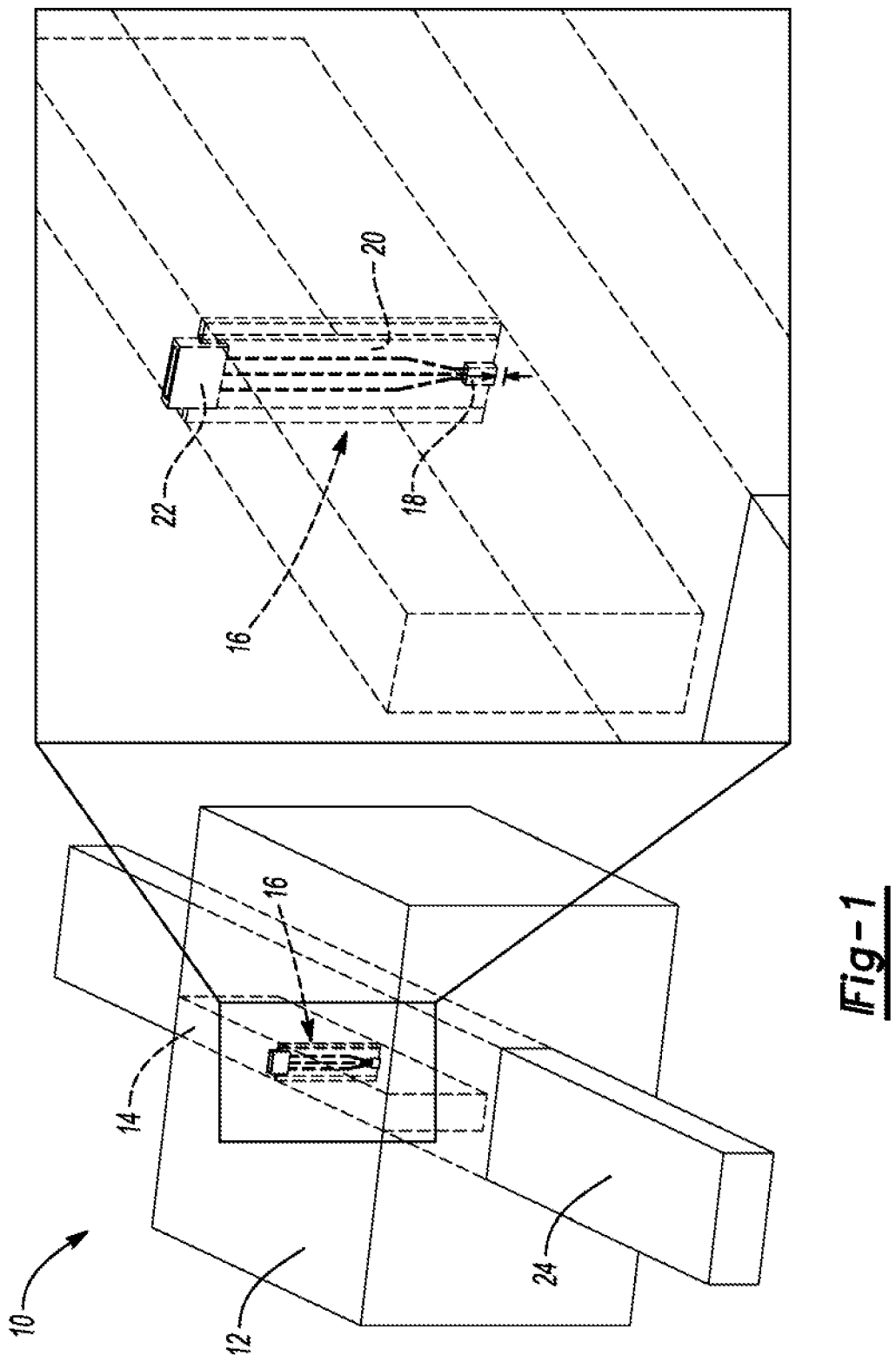
FIG. 1 is a current sensing system which includes a ferromagnetic over-mold, a dielectric material, and a magnetic field sensor.

The disclosed embodiments are merely examples and other embodiments can take various and alternative forms. The figures are not necessarily to scale; some features could be exaggerated or minimized to show details of particular components. Therefore, specific structural and functional details disclosed herein are not to be interpreted as limiting, but merely as a representative basis for teaching one skilled in the art to variously employ the embodiments. As those of ordinary skill in the art will understand, various features illustrated and described with reference to any one of the figures can be combined with features illustrated in one or more other figures to produce embodiments that are not explicitly illustrated or described. The combinations of features illustrated provide representative embodiments for typical applications. Various combinations and modifications of the features consistent with the teachings of this disclosure, however, could be desired for particular applications or implementations.

As used in the specification and the appended claims, the singular form "a," "an," and "the" comprise plural referents unless the context clearly indicates otherwise. For example, reference to a component in the singular is intended to comprise a plurality of components.

The term "substantially" or "about" may be used herein to describe disclosed or claimed embodiments. The term "substantially" or "about" may modify a value or relative characteristic disclosed or claimed in the present disclosure. In such instances, "substantially" or "about" may signify that the value or relative characteristic it modifies is within ±0%, 0.1%, 0.5%, 1%, 2%, 3%, 4%, 5% or 10% of the value or relative characteristic.

Although the terms first, second, third, etc. may be used to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Current sensors are a common, yet important, component of electrical devices such as electric vehicles (EVs). Conventionally, electrical current flow is measured by placing a substantially toroidal magnetic core (a ferromagnetic core) with an air gap (split) around a conductor such as a busbar or current conductive wire. A magnetic field sensor is then placed in the air gap. Passage of electrical current through the conductor creates a signal sensed by the magnetic field sensor (transducer) which is proportional to the flowing current. Hall effect and magnetoresistive field elements are commonly used in conjunction with other electronic components in such systems.

While effective, mainly because of their large magnetic cores, conventional current sensors may be costly and bulky. Also, apart from their potential cost and taxing space occupation, these systems may negatively affect busbar routing. Furthermore, core imperfections such as hysteresis or saturation can substantially affect the accuracy of such systems. To resolve one or more of the above-mentioned potential issues of cost, size, and error, an alternative current sensor system structure is proposed. In one example, a current sensor system integrated into (in proximity of) a busbar with a ferromagnetically impregnated epoxy core is proposed. Tight integration and packing of the current sensor imposes fewer design restrictions and/or weight/volume penalties.

The present disclosure relates to an electrical system (electrical current sensing arrangement) comprising a current sensing system. The current sensing system may comprise a polymer impregnated with ferromagnetic material, a dielectric material, and a magnetic field sensor. In some embodiments, the polymer impregnated (doped) with ferromagnetic material may be a thermoset. Thermoset polymers in the present disclosure refer to polymers that are irreversibly hardened and retain their solid state after being cured. In some embodiments, the polymer impregnated with ferromagnetic material of the present disclosure may be epoxy, silicone, polyurethane, phenolic, or any combination thereof. Similarly, in some embodiments the ferromagnetic material used to impregnate the polymer may be iron, nickel, cobalt, or any combination thereof. Further, ferromagnetic material impregnation may be uniform or non-uniform. It is to be understood, that other embodiments are not limited to the specific embodiments/materials disclosed above. Rather, the choice of polymer and ferromagnetic material, along with other components, depends on the specific application and condition.

For the purposes of the present disclosure, dielectric material refers to those that are poor conductors of electricity but are readily polarized when subjected to electricity. Indeed, dielectric material may be solid, liquid, or gaseous. For the purposes of the present disclosure, any dielectric material with sufficient strength may be used depending on the application and conditions. In some embodiments, the dielectric material used may be solid. In other embodiments, the dielectric material used may be liquid. Yet in other embodiments, the dielectric material used may be gaseous. Non-limiting examples of dielectric material which may be used are polymer-based dielectric material, porcelain, ceramic, glass, dry air, or distilled water. In some embodiments, the dielectric material is a dielectric thermoset polymer. In one embodiment, the dielectric material may be a non-impregnated epoxy over-mold. For the purposes of the present disclosure, any compatible magnetic field sensor may be used. In some embodiments, the magnetic field sensor may have a Hall-effect or a magnetoresistive element.

Referring to FIG. 1, a current sensing system 10 is proposed. The current sensing system 10 may comprise a ferromagnetic over-mold 12, a dielectric non-ferromagnetic over-mold 14, and a magnetic field sensor (transducer or magnetic based sensor) 16. The magnetic field sensor 16 may further comprise a magnetic field detector (such as a Point Field Detector (PFD)) 18, a substrate (such as a Printed Circuit Board (PCB)) 20, and a connector 22. More particularly, FIG. 1 shows portions of a busbar 24 housed within (or encapsulated in) the ferromagnetic over-mold 12 and the dielectric non-ferromagnetic over-mold 14. In some embodiments, the ferromagnetic over-mold 12 may be isolated from the busbar 24 using the dielectric non-ferromagnetic over-mold 14 such that only the dielectric non-ferromagnetic over-mold is in contact with the busbar 24. In some embodiments, the ferromagnetic over-mold 12, separated from busbar 24, may have a pocket for the dielectric non-ferromagnetic over-mold and/or magnetic field sensor 16. In some embodiments, the magnetic field sensor 16 may be housed within (suspended in) the dielectric non-ferromagnetic over-mold 14.

The ferromagnetic over-mold 12, isolated from the busbar 24, may concentrate the magnetic field generated via the flow of electrical current through the busbar 24. In some embodiments, the magnetic field generated, via the flow of electrical current, may activate the magnetic field sensor 16. In some embodiments, the flux-concentrating ferromagnetic over-mold 12 may increase the magnetic field sensor's accuracy, linearity, and sensitivity. Additionally, since according to the present disclosure, flux concentration is accomplished via an over-molding of an impregnated polymer instead of a separate ferromagnetic core, as in conventional current sensing systems, certain embodiments allow for a decrease in packaging requirements and an increase in design flexibility. Furthermore, by integrating the current sensor system 10 with the busbar 24, the routing of the busbar 24 is less constrained to be compatible with the placement of a large block of collected current sensors.

Figure 2:
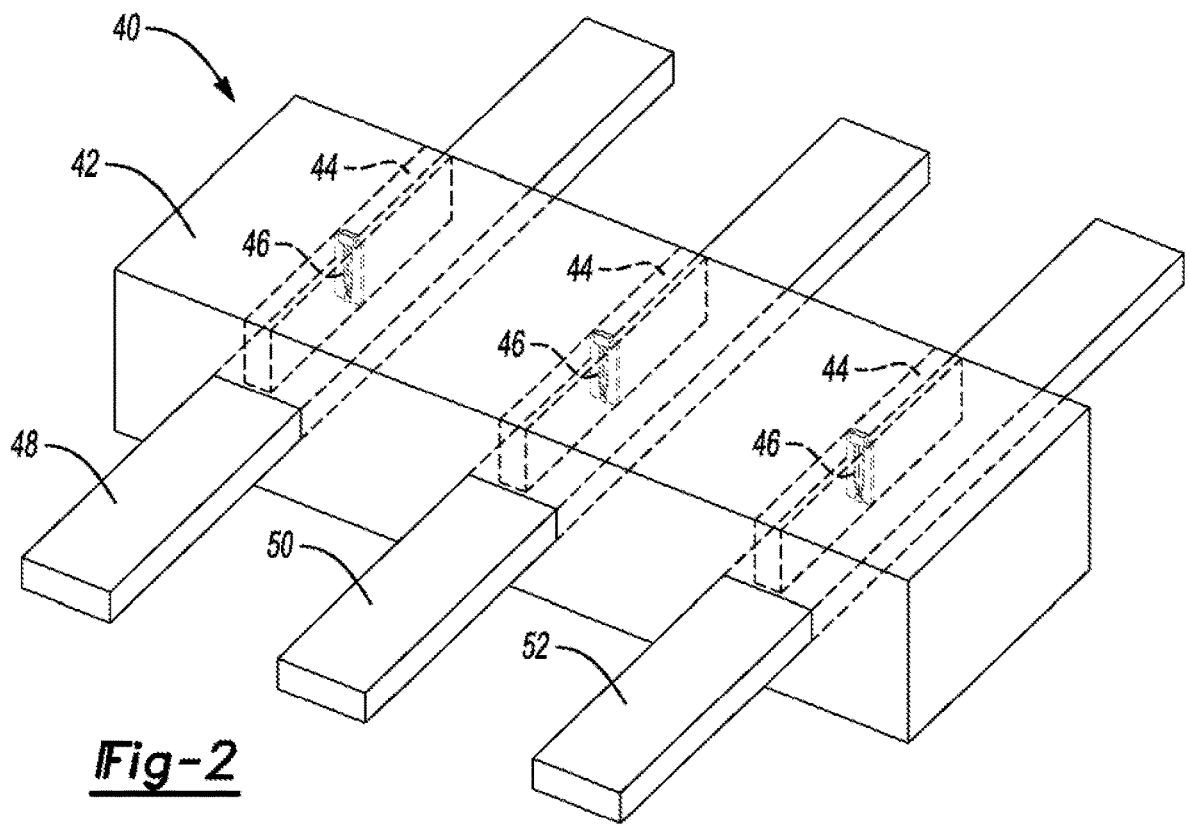
FIG. 2 is a multi-phase design of a current sensing system.

Referring to FIG. 2, a current sensing system 40 is proposed. The current sensing system 40 may comprise at least one ferromagnetic over-mold 42, at least one dielectric non-ferromagnetic over-mold 44, and at least one magnetic field sensor (transducer or magnetic based sensor) 46. More particularly, FIG. 2 shows an exemplary three-phase design of the current sensing system 40. It is to be understood that the present disclosure is not limited to such three-phase systems. Rather, embodiments may have any number of busbars and/or conductive wires. In some embodiments, at least one busbar (here 48, 50, and 52) may be housed within the at least one ferromagnetic over-mold (here 42) and/or the at least one dielectric non-ferromagnetic over-mold (here 44).

In some embodiments, such as that demonstrated in FIG. 2, one ferromagnetic over-mold 42 may be used to concentrate the magnetic field generated via the flow of electrical current through multiple busbars (here the busbars 48, 50, and 52). Such an embodiment which may accomplish flux concentration via a single ferromagnetic over-mold 42 may substantially reduce the number of parts needed as well as assembly complexity. In other embodiments, however, one or more ferromagnetic over-molds may be used. Similarly, in some embodiments, such as that demonstrated in FIG. 2, multiple dielectric non-ferromagnetic over-molds 44 may be used to isolate the ferromagnetic over-mold 42 from the busbars 48, 50, and 52. In other embodiments, however, one dielectric non-ferromagnetic over-mold may be used across multiple busbars isolating them from the one or more ferromagnetic over-mold.

In some embodiments, such as that shown in FIG. 2, the at least one ferromagnetic over-mold 42, separated from the busbars 48, 50, and 52, may have at least one pocket for the at least one dielectric non-ferromagnetic over-mold 44 and/or the at least one magnetic field sensor 46. In some embodiments, the at least one magnetic field sensor 46 may be housed within the at least one dielectric non-ferromagnetic over-mold 44. In some embodiments, the magnetic field generated, via the flow of electrical current, may activate the at least one magnetic field sensor 46. In some embodiments, the at least one flux-concentrating ferromagnetic over-mold 42 may increase the at least one magnetic field sensor's accuracy, linearity, and sensitivity.

Additionally, since according to the present disclosure, flux concentration may be accomplished via a single over-molding of an impregnated polymer instead of a separate ferromagnetic core, as in conventional current sensing systems, the present disclosure allows for a decrease in packaging requirements and an increase in design flexibility. Furthermore, by integrating the current sensor system 40 with the busbars 48, 50, and 52, busbar routing is less constrained to be compatible with the placement of a large block of collected current sensors.

Figure 3:
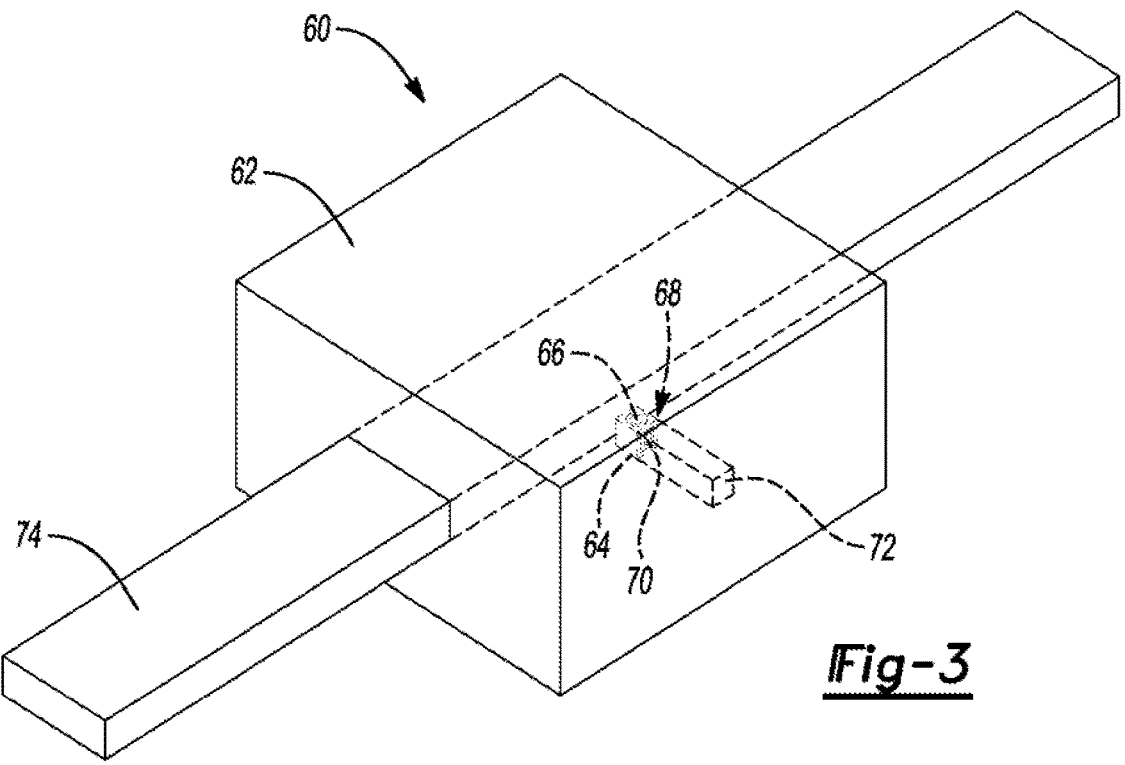
FIG. 3 is a current sensing system which includes a ferromagnetic over-mold and a magnetic field sensor housed within an electrically insulating shell in proximity of the short end of a busbar.

Referring to FIG. 3, a current sensing system 60 is proposed. The current sensing system 60 may comprise a ferromagnetic over-mold 62 and a magnetic field sensor (transducer or magnetic based sensor) 64. The magnetic field sensor 64 may further comprise a magnetic field detector (such as a Point Field Detector (PFD)) 66, a substrate (such as a Printed Circuit Board (PCB)) 68, and a connector 70 housed inside an insulating packaging 72. In some embodiments, such as that shown in FIG. 3, the insulating packaging 72 of the magnetic field sensor 64 may provide the electrical isolation necessary that would otherwise be achieved using a dielectric non-ferromagnetic over-mold. More particularly, FIG. 3 shows a portion of busbar 74 housed within the ferromagnetic over-mold 62. The ferromagnetic over-mold 62 may be isolated from the busbar 74 using the insulating packaging 72 of the magnetic field sensor 64 such that only the insulating packaging 72 contacts the busbar 74. In some embodiments, the ferromagnetic over-mold 62, separated from the busbar 74, may have a pocket for the magnetic field sensor 64. In some embodiments, the magnetic field sensor 64, housed within the insulating packaging 72, isolated from the ferromagnetic over-mold 62, may be placed in proximity of the busbar 74 such that the magnetic field generated, via the flow of electrical current, may activate the magnetic field sensor 64.

In some embodiments, the flux-concentrating ferromagnetic over-mold 62 may increase the magnetic field sensor's accuracy, linearity, and sensitivity. Additionally, since according to the present disclosure, flux concentration is accomplished via an over-molding of an impregnated polymer instead of a separate ferromagnetic core, as in conventional current sensing systems, and the insulating packaging 72 of the magnetic field sensor 64 may sufficiently isolate the sensor from the ferromagnetic over-mold 62, this embodiment allows for a decrease in packaging requirements and an increase in design flexibility. Furthermore, by integrating the current sensor system 60 with the busbar 74, the routing of the busbar 74 is less constrained to be compatible with the placement of a large block of collected current sensors.

Certain embodiments offer significant design flexibility. For example, in some embodiments, such as that shown in FIG. 3, the magnetic field sensor 64 may be placed along a short side of the busbar 74. This flexibility in placement of the magnetic field sensor 64 may substantially simplify common busbar routing issues. Similarly, in some embodiments, additional magnetic field sensors may be embedded in, yet isolated from, the ferromagnetic over-mold to provide redundancy, increase the fault tolerance, and enable the diagnosis of a faulty magnetic field sensor. For example, referring to FIGS. 4A and 4B, a current sensing system 80 may comprise a ferromagnetic over-mold 82, a first magnetic field sensor 84, and a second magnetic field sensor 86. In some embodiments, such as that shown in FIG. 4A, the first magnetic field sensor 84 and the second magnetic field sensor 86 of the current sensing system 80 may be placed on the opposing sides of a busbar 88. In other embodiments, such as that shown in FIG. 4B, the first magnetic field sensor 84 and the second magnetic field sensor 86 may be placed on the same side of the busbar 88.

Figure 4A:
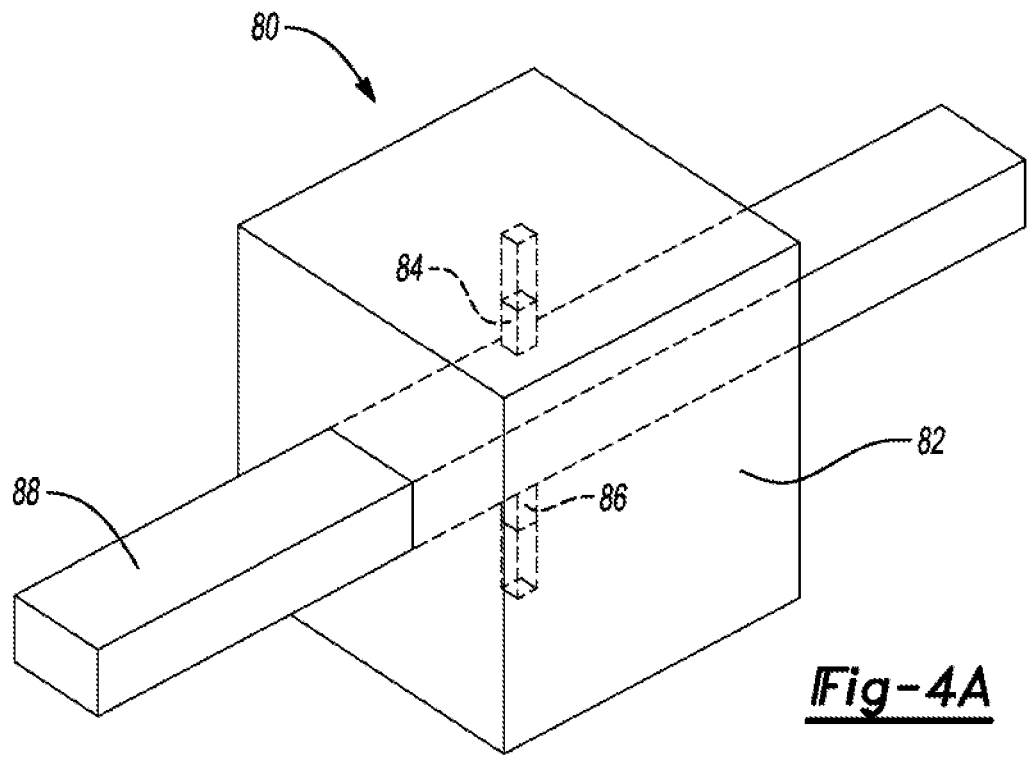
FIGS. 4A and 4B are current sensing systems that include more than one magnetic field sensor.
Figure 4B:
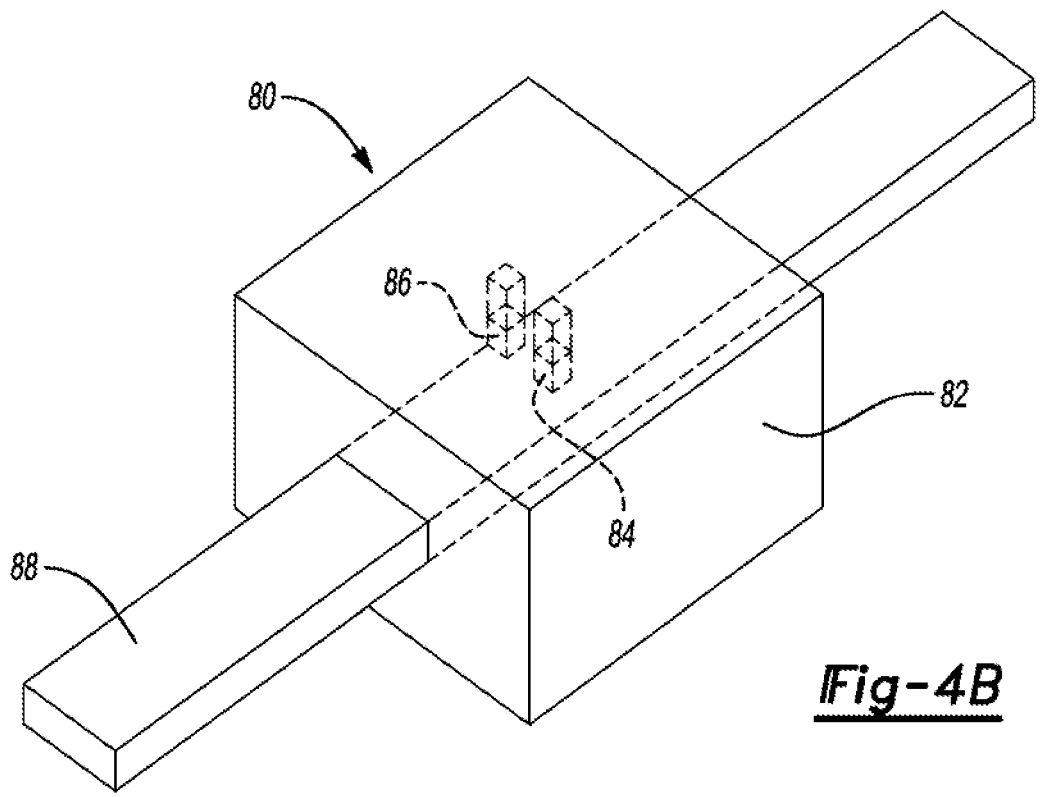

In exemplary embodiments shown in FIGS. 4A and 4B, like the embodiment shown in FIG. 3, the first magnetic field sensor 84 and the second magnetic field sensor 86 may have at least one insulating packaging to isolate said sensors from the ferromagnetic core 82 and from the busbar 88. In other embodiments however, this isolation of the magnetic field sensors from the ferromagnetic core may be achieved using one or more dielectric non-ferromagnetic over-mold(s) (i.e., dielectric material) such that only the dielectric non-ferromagnetic material contacts the busbar. Another possible advantage of the present disclosure pertains to the design flexibility of the shape of both ferromagnetic and dielectric material. Simply put, the shape of ferromagnetic over-mold (and dielectric non-ferromagnetic over-mold) of the present disclosure is not limited to cuboidal (as shown in FIGS. 1-4 and 6) or toroidal as with conventional current sensing systems. Rather, depending on the application and conditions, other shapes may be used.

Figure 5:
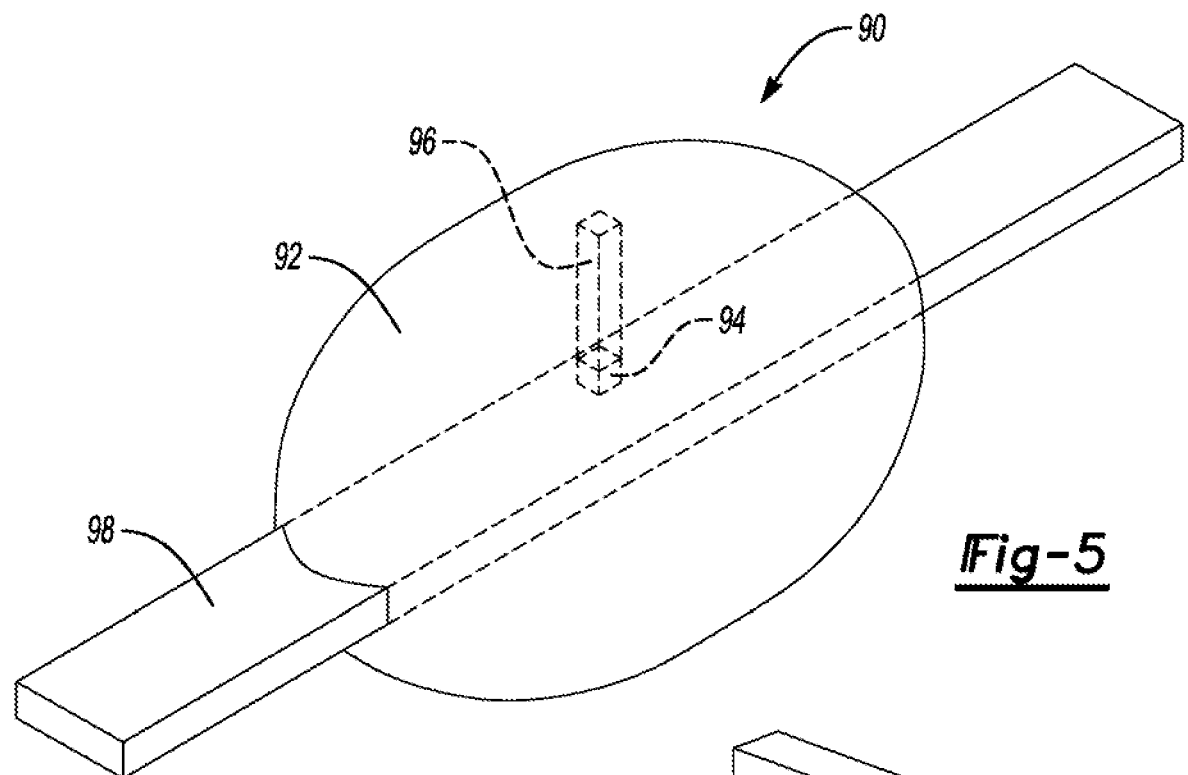
FIG. 5 is a current sensing system which has an ovoid shape ferromagnetic over-mold.

Referring to FIG. 5, a current sensing system 90 is shown. The current sensing system 90 may comprise a ferromagnetic over-mold 92 and a magnetic field sensor (transducer or magnetic based sensor) 94. The magnetic field sensor 94 may further comprise an insulating packaging 96 housing the magnetic field sensor's necessary current sensing circuitry. More particularly, FIG. 5 shows an exemplary embodiment of the present disclosure, where a portion of a busbar 98 may be housed within a substantially ovoid ferromagnetic over-mold 92. In some embodiments, the ferromagnetic over-mold 92 encapsulates a portion of the busbar 98 and the insulating packaging 96 (or a dielectric material) such that the insulating packaging 96 (or the dielectric material) is disposed against the busbar 98 and the magnetic field sensor 94, housed within the insulating packaging 96 (or the dielectric material), is spaced away from the busbar 98 and the ferromagnetic over-mold 92 is not between the busbar 98 and the magnetic field sensor 94. While FIG. 5 demonstrates a substantially ovoid ferromagnetic over-mold, the present disclosure is not limited to such a shape. Rather, it is to be understood that both the ferromagnetic over-mold and the dielectric material (dielectric non-ferromagnetic over-mold) or insulating packaging of the magnetic field sensor may assume any shape necessary to efficiently concentrate the magnetic field generated by the passage of electrical current through a conductive medium and meet the design demands.

Figure 6:
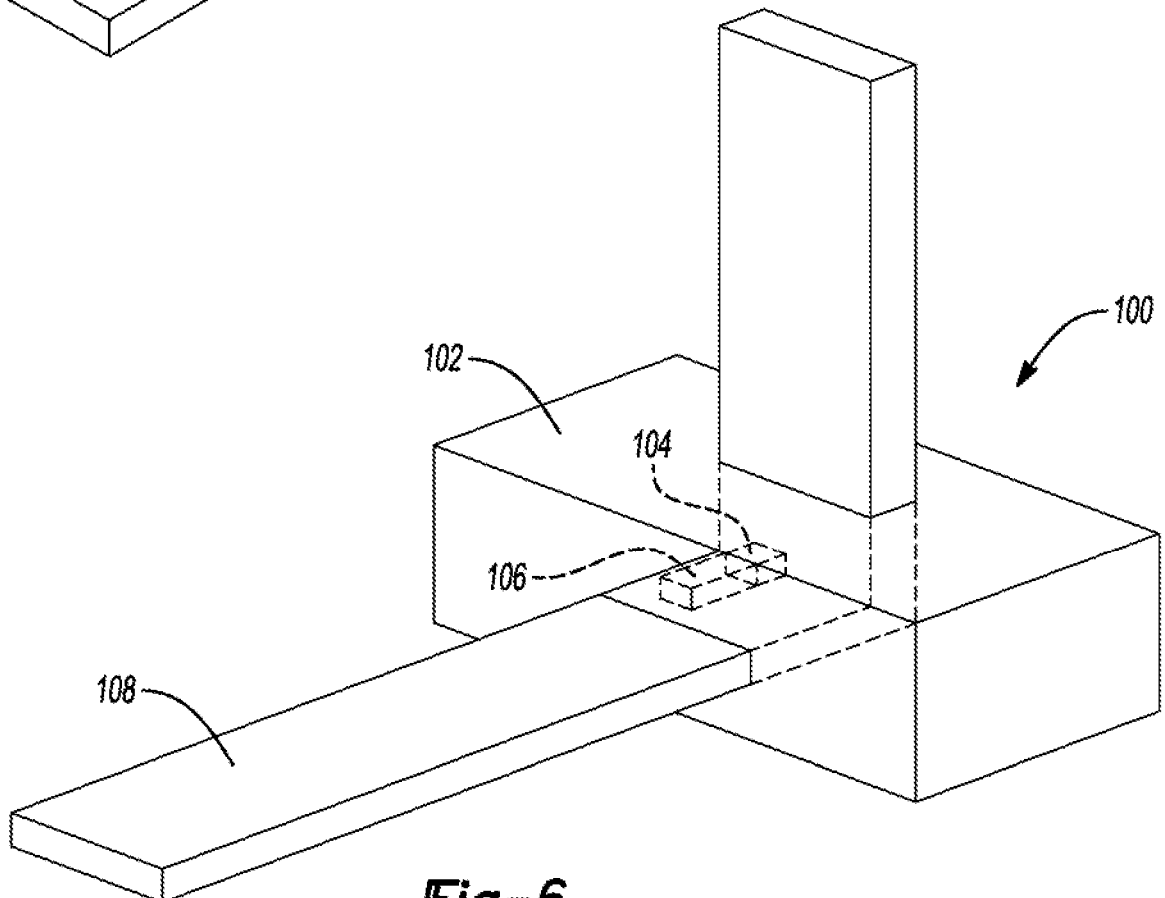
FIG. 6 is a current sensing system positioned at a non-straight (bent) section of a busbar.

Referring to FIG. 6, a current sensing system 100 is shown. The current sensing system 100 may comprise a ferromagnetic over-mold 102 and a magnetic field sensor (transducer or magnetic based sensor) 104. The magnetic field sensor 104 may further comprise an insulating packaging 106 housing the magnetic field sensor's necessary current sensing circuitry. In some embodiments, the current sensing system 100 may further comprise a dielectric non-ferromagnetic over-mold insulating the magnetic field sensor 104 from the ferromagnetic over-mold 102 and preventing the magnetic field sensor 104 from contacting a busbar 108 which may be achieved by the insulating packaging 106 without the dielectric non-ferromagnetic over-mold. FIG. 6 shows an exemplary embodiment of the present disclosure, where the current sensing system 100 is integrated with portions of the busbar 108 at a non-straight section of this busbar. In some embodiments, the non-straight section of the busbar 108 may be a bent busbar defining a corner between a pair of legs having an inner portion and an outer portion. In other embodiments, the non-straight section of the busbar 108 may comprise a plurality of busbars conductively coupled together.

More particularly, FIG. 6 shows an exemplary embodiment of the present disclosure where the ferromagnetic over-mold 102 is integrated with portions of the busbar 108 at a substantially right angle. In other embodiments of the present invention, the ferromagnetic over-mold 102 may be integrated with one or more busbars at an acute, obtuse, or a reflex angle. In some embodiments, the ferromagnetic over-mold 102 may be integrated with one or more busbars with legs defining an angle therebetween that is no greater than 90 degrees. This flexibility with the placement of the ferromagnetic over-mold is a possible advantage. Such flexibility is typically absent from conventional current sensing systems. For example, placement of a conventional toroidal core around a bend such as that shown in FIG. 6 may be difficult, if not impossible. Furthermore, placement of the current sensing system at a non-straight section of a busbar may be of particular importance. This is because such non-straight sections typically exhibit automatic flux intensification attributes. In some embodiments, the bent busbar 108 electrically connects cells of a battery. Amongst other applications, the current sensing system 100 may be used to evaluate and actively influence the charging and discharging cycle of the battery and to control the pulse-width modulated inverter switches.

In some embodiments, like that shown in FIG. 6, the magnetic field sensor 104 may be disposed in the inner portion of the corner defined by the legs of the busbar 108 and spaced away from the legs such that the magnetic field sensor 104 is between the legs. In some embodiments of the present disclosure, an insulating packaging 106 or a dielectric non-ferromagnetic over-mold may encapsulate the magnetic field sensor 104 and may be in direct contact with the legs of the busbar 108. Furthermore, in some embodiments, like that shown in FIG. 6, the ferromagnetic over-mold 102 encapsulates the insulating packaging 106 (or the dielectric non-ferromagnetic over-mold) and the corner defined by the legs of the busbar 108.

While exemplary embodiments are described above, it is not intended that these embodiments describe all possible forms encompassed by the claims. The words used in the specification are words of description rather than limitation, and it is understood that various changes can be made without departing from the spirit and scope of the disclosure.

As previously described, the features of various embodiments can be combined to form further embodiments that may not be explicitly described or illustrated. While various embodiments could have been described as providing advantages or being preferred over other embodiments or prior art implementations with respect to one or more desired characteristics, those of ordinary skill in the art recognize that one or more features or characteristics can be compromised to achieve desired overall system attributes, which depend on the specific application and implementation. These attributes may include, but are not limited to cost, strength, durability, life cycle cost, marketability, appearance, packaging, size, serviceability, weight, manufacturability, ease of assembly, etc. As such, embodiments described as less desirable than other embodiments or prior art implementations with respect to one or more characteristics are not outside the scope of the disclosure and can be desirable for particular applications.

What is claimed is:

1. An electrical system comprising:
a bent busbar defining a corner between a pair of legs;
a magnetic field sensor disposed in an inner portion of the corner and spaced away from the legs such that the magnetic field sensor is between the legs;
a dielectric material encapsulating the magnetic field sensor and in direct contact with the legs; and
a ferromagnetic over-mold encapsulating the corner and the dielectric material.

2. The electrical system of claim 1, wherein the dielectric material is a dielectric thermoset polymer.

3. The electrical system of claim 2, wherein the thermoset polymer is epoxy.

4. The electrical system of claim 1, wherein the ferromagnetic over-mold includes a thermoset polymer.

5. The electrical system of claim 1, wherein the magnetic field sensor is a hall sensor.

6. The electrical system of claim 1, wherein the magnetic field sensor is a magnetoresistive sensor.

7. The electrical system of claim 1, wherein the bent busbar electrically connects cells of a battery.

8. The electrical system of claim 1, wherein the legs define an angle therebetween no greater than 90 degrees.

9. An electrical current sensing arrangement comprising:
a busbar;
a dielectric material containing therein a magnetic field sensor; and
a ferromagnetic over-mold encapsulating a portion of the busbar and the dielectric material, wherein the dielectric material is disposed against the busbar such that the magnetic field sensor is spaced away from the busbar and the ferromagnetic over-mold is not between the busbar and the magnetic field sensor.

10. The electrical current sensing arrangement of claim 9, wherein the dielectric material is a thermoset polymer.

11. The electrical current sensing arrangement of claim 9, wherein the dielectric material encapsulates a portion of the busbar.

12. The electrical current sensing arrangement of claim 9, wherein the dielectric polymer contains therein a second magnetic field sensor.

13. The electrical current sensing arrangement of claim 12, wherein the second magnetic field sensor is disposed on a side of the busbar opposite the magnetic field sensor.

14. The electrical current sensing arrangement of claim 12, wherein the second magnetic field sensor is disposed on a same side of the busbar as the magnetic field sensor.

15. The electrical current sensing arrangement of claim 9, wherein a shape of the ferromagnetic over-mold is spherical or ovoid.

16. The electrical current sensing arrangement of claim 10, wherein the dielectric thermoset polymer is epoxy.

17. The electrical current sensing arrangement of claim 9, wherein the ferromagnetic over-mold includes epoxy.

18. An electrical system comprising:
a plurality of busbars;
a plurality of housings;
a plurality of magnetic field sensors each disposed adjacent to one of the busbars and contained by one of the housings, wherein the housings are configured to electrically insulate the magnetic field sensors from the busbars; and
at least one ferromagnetic over-mold encapsulating portions of the busbars and the housings.

19. The electrical system of claim 18, wherein the housings configured to electrically insulate the magnetic field sensors from the busbar are dielectric thermoset polymers.

20. The electrical system of claim 19, wherein the dielectric thermoset polymers comprise epoxy.

* * * * *